United States Patent
Strohmaier et al.

(10) Patent No.: US 8,175,130 B2
(45) Date of Patent: May 8, 2012

(54) DIODE LASER STRUCTURE FOR GENERATING DIODE LASER RADIATION

(75) Inventors: Stephan Gregor Patrick Strohmaier, Aichhalden (DE); Christoph Tillkorn, Zimmern (DE)

(73) Assignee: TRUMPF LASER GmbH + Co. KG, Schramberg (DE)

( * ) Notice: Subject to any disclaimer, the term of this patent is extended or adjusted under 35 U.S.C. 154(b) by 100 days.

(21) Appl. No.: 12/854,376

(22) Filed: Aug. 11, 2010

(65) Prior Publication Data

US 2011/0019710 A1    Jan. 27, 2011

Related U.S. Application Data

(63) Continuation of application No. PCT/EP2009/000765, filed on Feb. 5, 2009.

(30) Foreign Application Priority Data

Feb. 11, 2008   (EP) ..................................... 08002444

(51) Int. Cl.
  *H01S 5/00*   (2006.01)
(52) U.S. Cl. .................................. 372/50.12; 372/50.1
(58) Field of Classification Search ............... 372/50.12, 372/50.1
  See application file for complete search history.

(56) References Cited

U.S. PATENT DOCUMENTS

| | | | |
|---|---|---|---|
| 5,565,693 A | 10/1996 | Sasaki et al. | |
| 6,240,116 B1 | 5/2001 | Lang et al. | |
| 2004/0190580 A1 | 9/2004 | Pezeshki et al. | |
| 2004/0233964 A1 | 11/2004 | Yamanaka et al. | |
| 2006/0159147 A1* | 7/2006 | Grenier et al. | 372/50.12 |
| 2007/0116077 A1* | 5/2007 | Farmer et al. | 372/50.12 |
| 2007/0195850 A1 | 8/2007 | Schluter et al. | |

FOREIGN PATENT DOCUMENTS

| | | |
|---|---|---|
| JP | 5110187 | 4/1993 |
| JP | 6132610 | 5/1994 |
| JP | 2003344803 | 12/2003 |
| JP | 2007214300 | 8/2007 |
| JP | 2007324312 | 12/2007 |

OTHER PUBLICATIONS

International Search Report for corresponding PCT Application No. PCT/EP2009/000765, mailed May 20, 2009, 10 pages.
Notification of Transmittal of Translation of the International Preliminary Report on Patentability for corresponding PCT Application PCT/EP2009/000765, mailed Sep. 16, 2010, 7 pages.

* cited by examiner

*Primary Examiner* — Kinam Park
(74) *Attorney, Agent, or Firm* — Fish & Richardson P.C.

(57) ABSTRACT

A diode laser structure includes multiple stripe emitters disposed next to each other, in which each of the stripe emitters is configured to emit, during operation, a laser beam having a corresponding beam parameter product with respect to a slow axis ($BPP_{SA}$), where the stripe emitters are arranged such that the corresponding $BPP_{SA}$ of the laser beams successively decrease from a center of the diode laser structure towards a first edge of the diode laser structure and from the center of the diode laser structure towards a second edge of the diode laser structure, the second edge being opposite the first edge. The stripe emitters are oriented in a direction of the slow axis and are offset from one another in the direction of the slow axis.

17 Claims, 5 Drawing Sheets

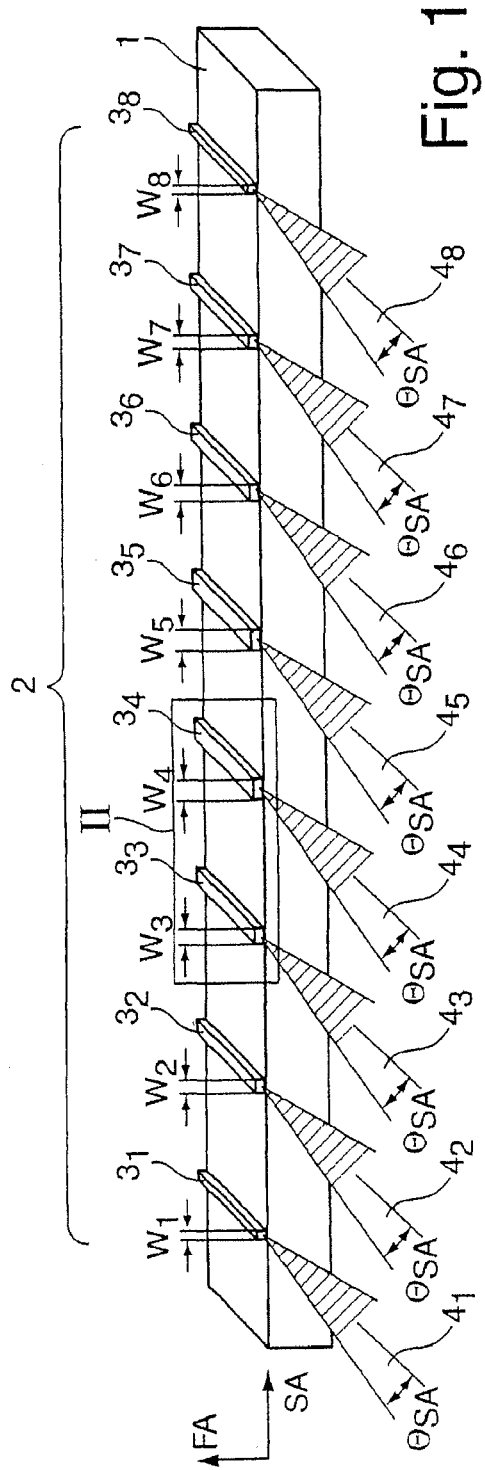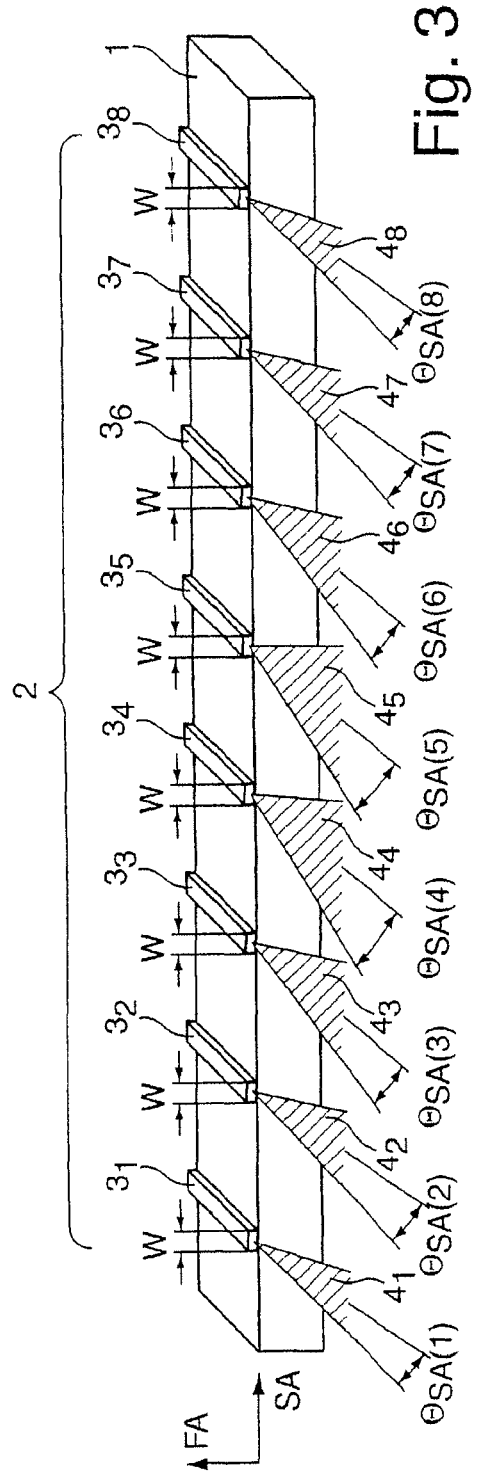

DIODE LASER STRUCTURE FOR GENERATING DIODE LASER RADIATION

CROSS-REFERENCE TO RELATED APPLICATIONS

This application is a continuation of and claims priority under 35 U.S.C. §120 to PCT/EP2009/000765, filed on Feb. 5, 2009, and designating the U.S., which claims priority under 35 U.S.C. §119 to European Patent Application No. 08 002 444.1, filed on Feb. 11, 2008. The contents of the prior applications are hereby incorporated by reference in their entirety.

TECHNICAL FIELD

The present disclosure relates to a diode laser structure for generating diode laser radiation. The diode laser structure includes several stripe emitters which are disposed next to each other, the slow axes of which are oriented in the same direction and are disposed offset from each other in this same direction, the beam parameter products, with respect to the slow axis, of at least two of the stripe emitters being different.

BACKGROUND

Either several single emitters (e.g., broad stripe emitters with typical widths of 50 to 500 µm) or diode bars consisting of several equally wide single emitters/broad stripe emitters (e.g., diode bars of typically 10 to 100 equally wide broad stripe emitters with a filling factor of 10 to 95%) can be used for generating efficient and high brilliance diode radiation. For example, diode bars of 30 to 50 emitters each having a width of 100 µm are often used on a bar of 1 cm with a filling factor between 30 and 50%.

The stripe-shaped single emitters of a diode bar each emit a laser beam which propagates in a fast axis (FA) direction in which the beam diverges fast, e.g., with a radiation angle of approximately 50°, and in a slow axis (SA) direction, which is perpendicular to the FA direction, and in which the beam diverges comparatively slowly, e.g., with a radiation angle of approximately 10°. The beam quality in the FA direction is optimum (almost diffraction-limited), whereas the beam quality in the SA direction is relatively poor. In order to combine these individual beams, they are initially collimated in the FA direction by means of a micro-optical cylindrical lens and are subsequently collimated in the SA direction by means of a cylindrical lens array. The beams are subsequently rotated through 90° by means of further micro-optics and are disposed next to each other. The combined laser beam is formed by aligned optical stacking of the laser beam strips emitted by the stripe-shaped single emitters. Since the single emitters are identical, the laser beams emitted from the single emitters each have the same beam parameter product with respect to the SA direction (BPPSA) and the same beam parameter product with respect to the FA direction (BPPFA), the beam parameter product BPP being defined as follows: $BPP_i = \theta_i * w_i$ (i=SA, FA), where $\theta$ is the divergence of the laser beam emitted by the emitter in the SA direction or the FA direction and w is the half width of the emitter in the SA or FA direction.

Aligned optical stacking of the laser beam strips with respectively identical $BPP_{SA}$ and $BPP_{FA}$ results in a combined laser beam that has a beam parameter product which is rectangular or square in the $BPP_{SA}$-$BPP_{FA}$-plane and is therefore coupled into a round fiber which has a round beam parameter product in the $BPP_{SA}$-$BPP_{FA}$ plane, thereby causing radiation losses or incomplete utilization of the fiber.

The document US 2007/0195850 A1 discloses stacking single emitters having different emitter widths in the SA direction on top of each other in the FA direction, thereby adjusting the $BPP_{SA}$ of each emitter to the $BPP_{SA}$ of the associated fiber area. However, handling and positioning of the individual emitters is very complex and this arrangement also requires a relatively large amount of space.

SUMMARY

The present disclosure is directed towards a diode structure that includes a diode bar with single emitters or a stack of diode bars with single emitters where the beam parameter product of the generated laser diode radiation is adjusted to the round beam parameter product of a fiber, into which the laser diode radiation is to be coupled, in a simple fashion and with compact dimensions.

The $BPP_{SA}$ of the stripe emitters decreases starting from the center of the diode laser structure towards both edges of the diode laser structure, in particular in a mirror-symmetrical fashion with respect to the center of the diode laser structure. In an alternative and/or supplementary fashion, the stripe emitters can be offset from each other in their beam propagation direction.

At least some of the stripe emitters disposed next to each other in the SA direction have different $BPP_{SA}$, which are adjusted in each case to the $BPP_{SA}$ of the associated fiber areas for optimum coupling into a round fiber. Towards this end, the $BPP_{SA}$ of the stripe emitters can be selected in such a fashion that they can be optically combined into a beam parameter product which is approximately round in the $BPP_{SA}$-$BPP_{FA}$ plane. In other words, the output radiation of the stripe emitters is adjusted with respect to the BPP of the fiber in the SA direction such that the laser diode radiation can be coupled into the fiber with high efficiency. The output power and/or efficiency can be increased by varying the beam parameter products of the stripe emitters. This approach can also be transferred to other fiber cross-sections such as, e.g., elliptical fiber cross-sections.

The stripe emitters can be formed using monochromatic emitters, (e.g., monochromatic multimode emitters) each having the same laser wavelength. Within the scope of the application, the term monochromatic emitters, i.e., emitters with one wavelength, also includes emitters which emit over the same bandwidth.

The beam parameter product of a stripe emitter can be adjusted by its width and by the divergence of the emitted laser beam. In some embodiments, at least some of the stripe emitters have different widths in the direction of their slow axes, whereas in other embodiments, at least some of the stripe emitters have different divergences with respect to the slow axis.

One or more of the stripe emitters can each be formed from a single emitter such that the diode laser structure has single emitters of different widths, each of which can have the same or different divergence with respect to the slow axis.

In some embodiments, one or more of the stripe emitters can each be formed from several single emitters that have the same or different widths and can have the same or different divergence with respect to the slow axis. Stripe emitters having different widths can each be formed using a different number of identical single emitters. Stripe emitters formed in this manner have the same divergence with respect to the slow axis.

For coupling the laser diode radiation into a fiber, the stripe emitters can have downstream optics which image the laser beams emitted by the stripe emitters in the form of parallel laser beam strips optically disposed next to each other in the direction of their fast axes, and onto a round fiber, where the beam parameter product, with respect to the slow axis, of each laser beam strip is adjusted to the beam parameter product, with respect to the slow axis, of an associated fiber area, i.e., the laser beam strip is adjusted with respect to the BPP of the associated fiber area in the SA direction.

Further advantages of the invention can be extracted from the claims, the description and the drawing. The features mentioned above and below can be used individually or collectively in arbitrary combination. The embodiments shown and described are not to be understood as exhaustive enumeration but have exemplary character for describing the invention.

BRIEF DESCRIPTION OF DRAWINGS

FIG. 1 is a schematic that shows a diode laser bar with a first diode laser structure.

FIG. 3 is a schematic that shows a diode laser bar with a second diode laser structure.

DETAILED DESCRIPTION

Figure 2A:
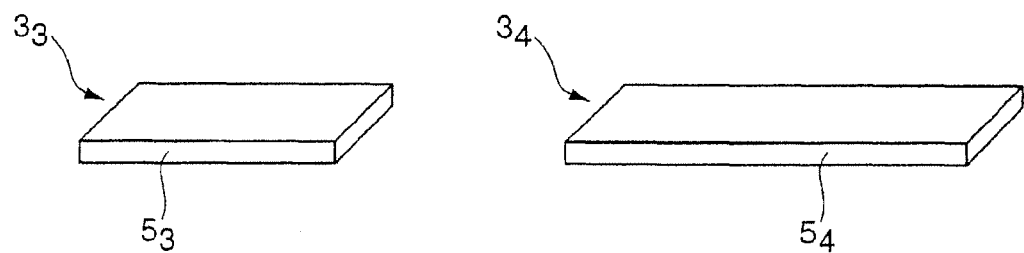
FIGS. 2a to 2c are schematics that show different embodiments of two stripe emitters of different width corresponding to the region II of FIG. 1.

The diode laser bar 1 shown in FIG. 1 has a diode laser structure 2 with eight stripe emitters 31 to 38 which are disposed parallel next to each other, the slow axes of which are oriented in the same direction (which is horizontal in FIG. 1) and which are each disposed at an offset from each other in this horizontal direction. Some of the stripe emitters 31 to 38 have different widths $w_1$ to $w_8$ in the SA direction, where the width of the stripe emitters 31 to 38 decreases starting from the center of the diode laser structure 2 towards the two edges of the diode laser structure 2 in a mirror-symmetrical fashion. The following applies: $w_4=w_5>w_3=w_6>w_2=w_7>w_1=w_8$. The width of the central emitters 34, 35 is, e.g., 50 to 500 μm. In a particular example, the width of the central emitters 34, 35 is between about 100 to 200 μm. The emitter width decreases towards the edges by up to 50%. For example, the emitter width can decrease toward the edges by up to 30% from emitter to emitter. The decrease in emitter width from emitter to emitter can be identical or different both in relative and absolute terms. The laser beams 41 to 48 emitted by the stripe emitters 31 to 38 can have the same divergence $\theta_{SA}$ in the SA direction. The beam parameter product, $BPP_{SA}(i)=w_{SA}(i)*\theta_{SA}(i)=w_{SA}(i)*\theta_{SA}$ (i=1, . . . , 8) with respect to the SA direction, is maximum in the center of the diode laser structure 2 and decreases towards the two edges of the diode laser structure 2. That is, the following applies: $BPP_{SA}(4)=BPP_{SA}(5)>BPP_{SA}(3)=BPP_{SA}(6)>BPP_{SA}(2)=BPP_{SA}(7)>BPP_{SA}(1)=BPP_{SA}(8)$. In contrast, the stripe emitters 31 to 38 can have the same height in the FA direction and their emitted laser beams 41 to 48 can have the same divergence in the FA direction. As is described in more detail below with reference to FIG. 5, the beam parameter products $BPP_{SA}(1)$ to $BPP_{SA}(8)$ with respect to the SA axis of the stripe emitters 31 to 38 can be selected such that they are optically combined into a beam parameter product which is approximately round in the $BPP_{SA}$-$BPP_{FA}$-plane.

The stripe emitters 31 to 38 can be formed by monochromatic emitters, such as multimode emitters, each having the same laser wavelength. Within the scope of the present specification, the term monochromatic emitters, i.e., emitters with one wavelength, also includes emitters emitting over the same bandwidth.

Figure 2B:
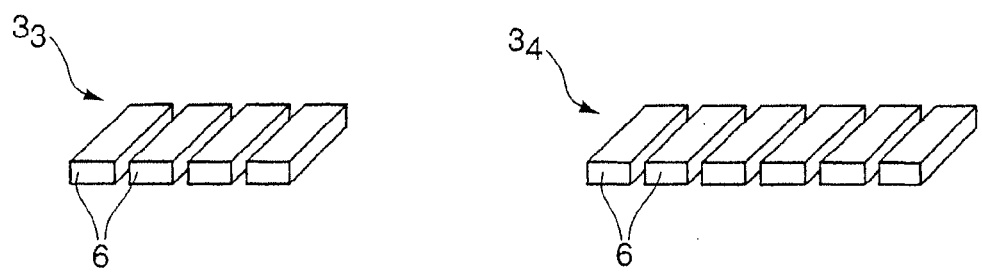
Figure 2C:
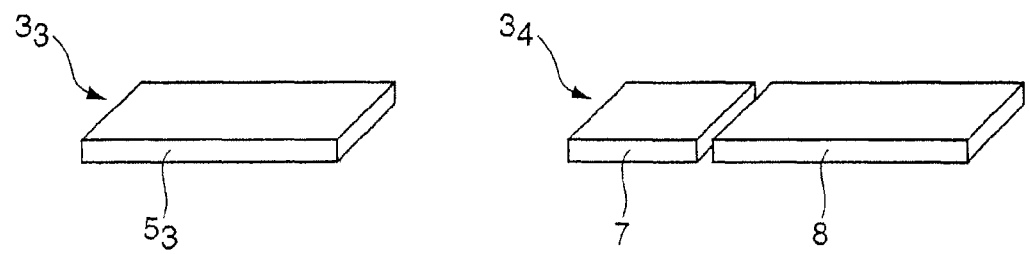

FIG. 2 shows different embodiments for the stripe emitters 33, 34 of different widths shown in FIG. 1. In FIG. 2a, the stripe emitters 33, 34 of different widths are each formed by one single emitter 53, 54, respectively. As an alternative to the use of single emitters of different widths, the single emitters can also be reproduced by groups with a different number of emitters. In FIG. 2b, the stripe emitters 33, 34 of different widths are each formed by a different number of identical, and therefore equally wide single emitters 6, thus ensuring identical threshold currents for each of the stripe emitters. The wider stripe emitter 34 in FIG. 2c is formed by two single emitters 7, 8 having different widths, which is suitable for stripe emitters to be presented having a width of more than 200 μm.

The diode laser bar 1 shown in FIG. 3 differs from the diode laser bar of FIG. 1 in that some of the stripe emitters 31 to 38 which are disposed next to each other, have a different divergence $\theta_{SA}(1)$ to $\theta_{SA}(8)$ with respect to the slow axis in each case, and each of the stripe emitters 31 to 38 have the same width w. The divergence of the stripe emitters 31 to 38 decreases starting from the center of the diode laser structure 2 towards both edges of the diode laser structure 2, for example, in a mirror-symmetrical fashion. The following applies: $\theta_{SA}(4)=\theta_{SA}(5)>\theta_{SA}(3)=\theta_{SA}(6)>\theta_{SA}(2)=\theta_{SA}(7)>\theta_{SA}(1)=\theta_{SA}(8)$. The beam parameter product $BPP_{SA}(i)=w(i)*\theta_{SA}(i)=w*\theta_{SA}(i)$ (i=1, . . . , 8), with respect to the SA direction, is maximum in the center of the diode laser structure 2 and decreases towards the two edges of the diode laser structure 2, for example, in a mirror-symmetrical fashion. In other words, the following applies: $BPP_{SA}(4)=BPP_{SA}(5)>BPP_{SA}(3)=BPP_{SA}(6)>BPP_{SA}(2)=BPP_{SA}(7)>BPP_{SA}(1)=BPP_{SA}(8)$. As is described in more detail below with respect to FIG. 5, the beam parameter products $BPP_{SA}(1)$ to $BPP_{SA}(8)$ of the stripe emitters 31 to 38, with respect to the slow axis, are selected in such a fashion that they can be optically combined into a beam parameter product which is approximately round in the $BPP_{SA}$-$BPP_{FA}$ plane.

Figure 4:
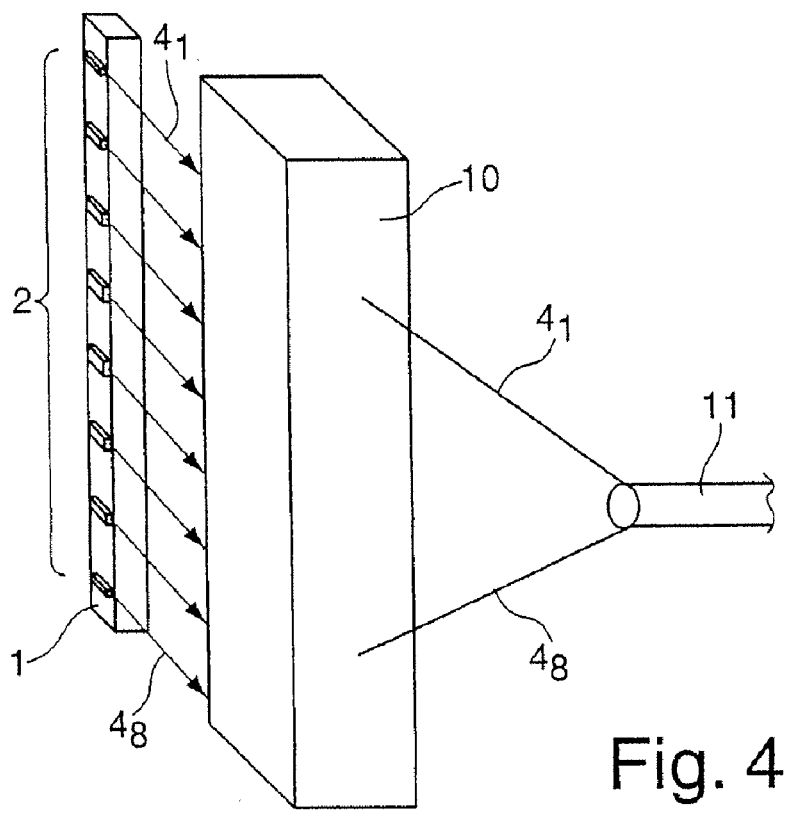
FIG. 4 is a schematic that shows an optical path of laser beams emitted by a diode laser structure and coupled into a fiber by means of optics.

FIG. 4 schematically shows the optical path of the laser beams 41 to 48 which are emitted by the inventive diode laser structure 2. The laser beams 41 to 48 are coupled into a round fiber 11 by means of an optics 10. The optics 10 transforms the individual laser beams 41 to 48 into a common laser beam in which the laser beams 41 to 48 emitted by the stripe emitters 31 to 38 are imaged onto the round fiber 11 as parallel laser beam strips, which are stacked on top of each other in the direction of their fast axes.

Figure 5:
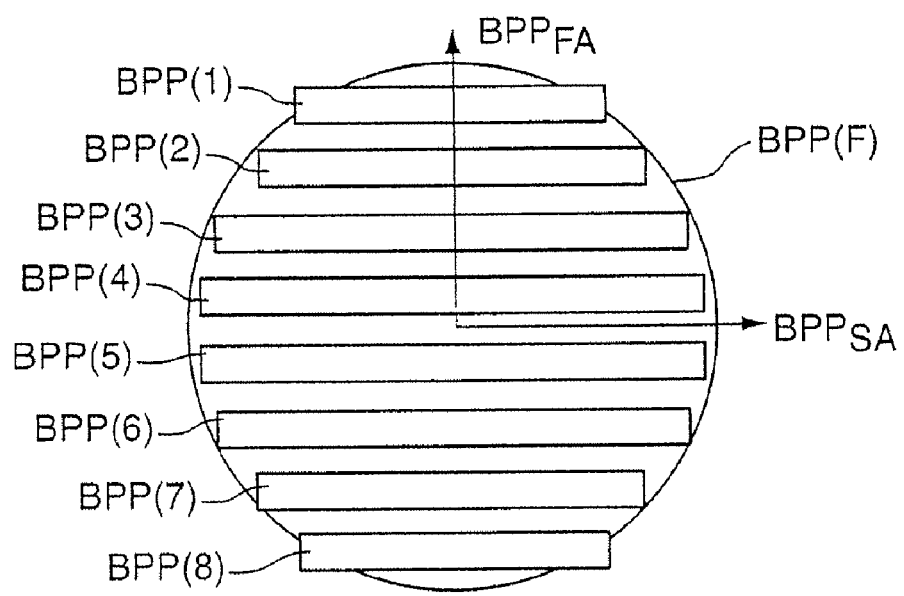
FIG. 5 shows the beam parameter products of laser beam strips emitted by stripe emitters and stacked on top of each other, in a $BPP_{SA}$-$BPP_{FA}$ plane.

FIG. 5 shows in the $BPP_{SA}$-$BPP_{FA}$ plane the beam parameter products BPP(1) to BPP(8) of the laser beam strips which are emitted by the stripe emitters 31 to 38 and stacked on top of each other. The beam parameter products, BPP(1) to BPP(8), are adjusted to the round beam parameter product BPP(F) of the round fiber 11. Towards this end, the beam parameter products BPP(1) to BPP(8) in the slow axis are adjusted to the associated beam parameter product of the associated fiber area. In other words, the beam parameter products $BPP_{SA}(1)$ to $BPP_{SA}(8)$ of the stripe emitters 31 to 38 are selected such that they can be optically combined into the beam parameter product BPP(F) of the fiber 11, which is round in the $BPP_{SA}$-$BPP_{FA}$ plane.

In the diode laser structures 2 shown in FIGS. 1 and 3, the decoupling surfaces of the stripe emitters 31 to 38 lie in a common plane that is perpendicular to the direction of propagation of the laser beams 41 to 48 emitted by the stripe emitters 31 to 38. FIGS. 6a to 6e show additional diode laser structures 2 of diode laser bars 1, in which the decoupling surfaces of the stripe emitters 31 to 38 do not lie in a common plane that is perpendicular to the direction of propagation of the laser beams 41 to 48 emitted by the stripe emitters 31 to 38.

Figure 6A:
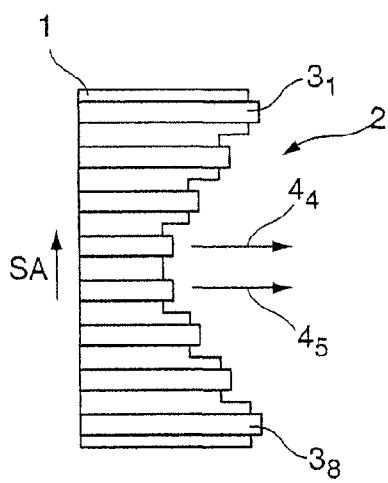
FIGS. 6a to 6e are schematics that show additional bar structures of a diode laser structure.
Figure 6B:
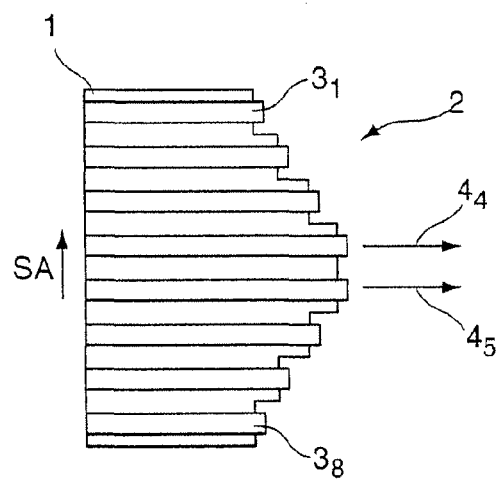

In FIGS. 6a and 6b, the decoupling surfaces of the stripe emitters 31 to 38 are disposed such that their ends facing away from the decoupling surfaces are in a common plane but have different lengths in the direction perpendicular to their SA and FA directions. The length of the stripe emitters 31 to 38 increases (FIG. 6a) or decreases (FIG. 6b) starting from the center of the diode laser structure 2 towards both edges of the diode laser structure 2. The decoupling surfaces of the stripe emitters 31 to 38 are offset from each other in the form of steps starting from the center of the diode laser structure 2 on both sides in the SA direction.

Figure 6C:
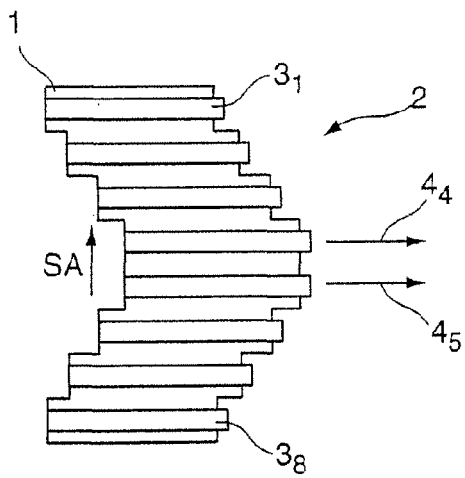
Figure 6D:
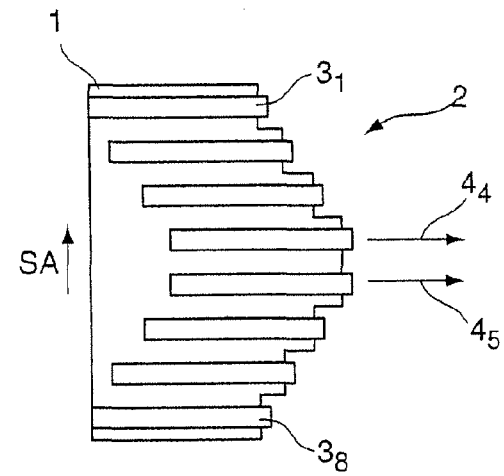
Figure 6E:
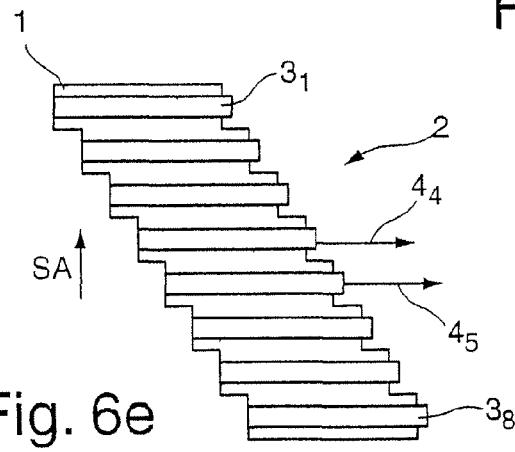
Figure 7:
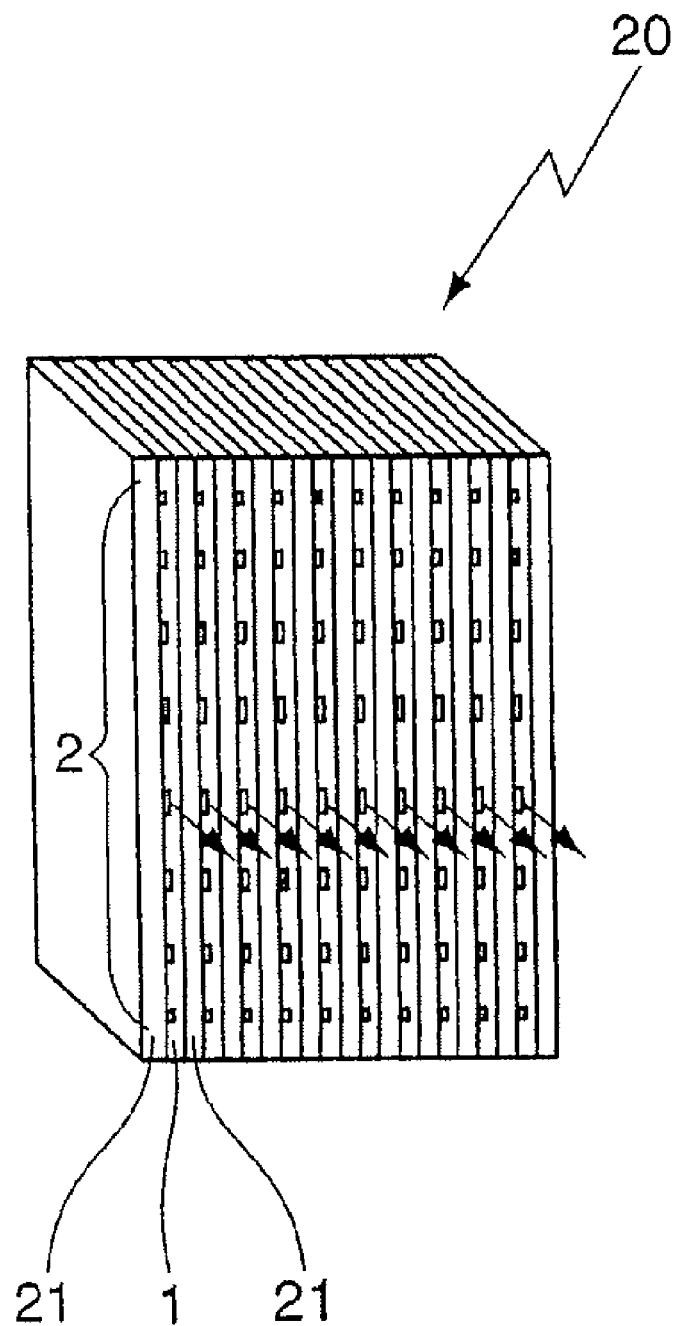
FIG. 7 is a schematic that shows a diode stack of several diode laser bars each having the first diode laser structure shown in FIG. 1.

In FIGS. 6c and 6d, the stripe emitters 31 to 38 have the same length in the direction perpendicular to their SA and FA directions and are disposed offset from each other in the form of steps on each side in the SA direction. The decoupling surfaces of the stripe emitters 31 to 38 are offset from each other in the form of steps on both sides in the SA direction starting from the center of the diode laser structure 2. While in FIG. 6c, the diode laser bar 1 is designed in the form of steps on the side facing away from the decoupling surfaces of the stripe emitters 31 to 38, the diode laser bar 1 in FIG. 6d is not designed in the form of steps on the side facing away from the decoupling surfaces of the stripe emitters 31 to 38. In FIG. 6e, identical stripe emitters 31 to 38 are disposed offset from each other in the form of steps in the SA direction. In FIG. 7, several diode laser bars 1 with the diode structure 2 shown in FIG. 1 are combined into a diode stack 20, in which each diode laser bar 1 is disposed between two heat sinks 21.

A number of embodiments have been described. Nevertheless, it will be understood that various modifications can be made without departing from the spirit and scope of the invention. Accordingly, other embodiments are within the scope of the following claims.

What is claimed is:

1. A diode laser structure comprising:
   a plurality of stripe emitters disposed next to each other, each of the stripe emitters being configured to emit, during operation, a laser beam having a corresponding beam parameter product with respect to a slow axis ($BPP_{SA}$), wherein the plurality of stripe emitters are arranged such that the corresponding $BPP_{SA}$ of the laser beams successively decrease from a center of the diode laser structure towards a first edge of the diode laser structure and from the center of the diode laser structure towards a second edge of the diode laser structure, the second edge being opposite the first edge,
   wherein the plurality of stripe emitters are oriented in a direction of the slow axis, and wherein the plurality of stripe emitters are offset from one another in the direction of the slow axis.

2. The diode laser structure according to claim 1, further comprising one or more optics configured to optically combine the laser beams into a combined beam corresponding to a cross-section of a fiber, with a $BPP_{SA}$ of the combined beam being matched to a beam parameter product of the fiber in the direction of the slow axis.

3. The diode laser structure according to claim 1, wherein a decoupling surface of each of the stripe emitters lies in a plane perpendicular to a propagation direction of the laser beam to be emitted by the corresponding stripe emitters during operation of the diode laser structure.

4. The diode laser structure according to claim 1, wherein the stripe emitters comprise monochromatic emitters.

5. The diode laser structure according to claim 1, wherein two or more of the stripe emitters have different corresponding widths in the direction of the slow axis.

6. The diode laser structure according to claim 5, wherein the different corresponding widths of the two or more stripe emitters successively decrease from the center of the diode laser structure towards the first edge of the diode laser structure and toward the second edge of the diode laser structure.

7. The diode laser structure according claim 1, wherein two or more of the stripe emitters each have a different divergence with respect to the slow axis ($\theta_{SA}$).

8. The diode laser structure according to claim 7, wherein the different $\theta_{SA}$ of the two or more stripe emitters decrease from the center of the diode laser structure towards the first edge of the diode laser structure and toward the second edge of the diode laser structure.

9. The diode laser structure according to claim 1, wherein at least one of the stripe emitters is a single emitter.

10. The diode laser structure according to claim 1, wherein at least one of the stripe emitters comprises a plurality of single emitters.

11. The diode laser structure according to claim 1, wherein at least two of the stripe emitters have different widths and each of the at least two stripe emitters comprises a different number of equally wide single emitters.

12. The diode laser structure according to claim 11, wherein each of the at least two stripe emitters having different widths comprises a plurality of single emitters having different widths.

13. The diode laser structure according to claim 1, further comprising one or more optics disposed downstream of the plurality of stripe emitters, wherein the one or more optics are configured to image the laser beams in the form of parallel laser beam strips optically disposed next to each other in a direction of a fast axis and onto a round fiber, wherein the $BPP_{SA}$ of each parallel laser beam strip matches the $BPP_{SA}$ of a corresponding fiber area.

14. The diode laser structure according to claim 1, wherein the plurality of stripe emitters are disposed on a laser diode bar.

15. The diode laser structure according to claim 1, further comprising a plurality of laser diode bars, wherein the plurality of stripe emitters are disposed on the plurality of laser diode bars and wherein the plurality of diode bars are arranged in a diode stack.

16. The diode laser structure of claim 1, wherein a decoupling surface of a first stripe emitter is offset in a step-like pattern from a decoupling surface of at least one other stripe emitter.

17. The diode laser structure of claim 1, wherein the plurality of stripe emitters are arranged in a mirror-symmetrical fashion with respect to the center of the diode laser structure.

* * * * *

UNITED STATES PATENT AND TRADEMARK OFFICE
CERTIFICATE OF CORRECTION

PATENT NO. : 8,175,130 B2
APPLICATION NO. : 12/854376
DATED : May 8, 2012
INVENTOR(S) : Stephan Gregor Patrick Strohmaier and Christoph Tillkorn Page 1 of 1

It is certified that error appears in the above-identified patent and that said Letters Patent is hereby corrected as shown below:

Column 6, line 20 (Claim 7, line 1) delete "according claim" and insert
--according to claim--.

Signed and Sealed this
Thirty-first Day of July, 2012

David J. Kappos
*Director of the United States Patent and Trademark Office*